United States Patent
Li

(10) Patent No.: US 10,339,870 B2
(45) Date of Patent: Jul. 2, 2019

(54) GOA CIRCUIT

(71) Applicant: Wuhan China Star Optoelectronics Technology Co., Ltd., Wuhan (CN)

(72) Inventor: Yafeng Li, Wuhan (CN)

(73) Assignee: WUHAN CHINA STAR OPTOELECTRONICS TECHNOLOGY CO., LTD., Wuhan, Hubei (CN)

(*) Notice: Subject to any disclaimer, the term of this patent is extended or adjusted under 35 U.S.C. 154(b) by 190 days.

(21) Appl. No.: 15/506,237

(22) PCT Filed: Dec. 30, 2016

(86) PCT No.: PCT/CN2016/113328
§ 371 (c)(1),
(2) Date: Feb. 24, 2017

(87) PCT Pub. No.: WO2018/119969
PCT Pub. Date: May 7, 2018

(65) Prior Publication Data
US 2018/0218686 A1  Aug. 2, 2018

(30) Foreign Application Priority Data
Dec. 27, 2016 (CN) .......................... 2016 1 1227417

(51) Int. Cl.
*G09G 3/36* (2006.01)
*G09G 3/3266* (2016.01)
(Continued)

(52) U.S. Cl.
CPC ......... *G09G 3/3266* (2013.01); *G09G 3/3258* (2013.01); *G09G 3/3648* (2013.01);
(Continued)

(58) Field of Classification Search
CPC .. G09G 3/3266; G09G 3/3648; G09G 3/3677; G09G 3/258; G09G 3/3696;
(Continued)

(56) References Cited

U.S. PATENT DOCUMENTS

| 2016/0086562 A1* | 3/2016 | Tan | G09G 3/3677 |
| | | | 345/215 |
| 2017/0032752 A1* | 2/2017 | Huang | G09G 3/3648 |
| 2017/0116924 A1* | 4/2017 | Zhang | G09G 3/3233 |

FOREIGN PATENT DOCUMENTS

| CN | 101364446 A | 2/2009 |
| CN | 106128379 A | 11/2016 |

* cited by examiner

*Primary Examiner* — Lunyi Lao
*Assistant Examiner* — Johny Lau
(74) *Attorney, Agent, or Firm* — Leong C. Lei

(57) ABSTRACT

The invention provides a GOA circuit, comprising a plurality of GOA units, for a positive integer n, n-th GOA unit comprising: a first TFT (T1), a second TFT (T2), a third TFT (T3), a fourth TFT T(4), a fifth TFT (T5), a sixth TFT (T6), a seventh TFT (T7), an eighth TFT (T8), a ninth TFT (T9), a tenth TFT (T10), a first capacitor (C1) and a second capacitor (T2). The invention, based on known GOA circuit, uses T9 and T10 so as to achieve forward and backward scanning without D2U and U2D control signals, which facilitates narrow border design and simplifies corresponding driving timing and reduce IC cost. The pre-charging unit formed by T1, T9, T3, and T10 effectively improves the current leakage and ensures GOA circuit stability.

17 Claims, 5 Drawing Sheets

(51) Int. Cl.
*G09G 3/3258* (2016.01)
*G11C 19/28* (2006.01)
*G11C 19/18* (2006.01)

(52) U.S. Cl.
CPC ......... *G09G 3/3677* (2013.01); *G09G 3/3696* (2013.01); *G11C 19/184* (2013.01); *G11C 19/28* (2013.01); *G09G 2300/0408* (2013.01); *G09G 2310/0283* (2013.01); *G09G 2310/08* (2013.01); *G09G 2320/0214* (2013.01)

(58) Field of Classification Search
CPC ....... G09G 2310/0283; G09G 2310/08; G09G 2320/0214; G09G 2300/0408; G11C 19/28; G11C 19/184
See application file for complete search history.

GOA CIRCUIT

BACKGROUND OF THE INVENTION

1. Field of the Invention

The present invention relates to the field of display, and in particular to a gate driver on array (GOA) circuit.

2. The Related Arts

The gate driver on array (GOA) technology is the array substrate column drive technology, by using the array substrate process for the LCD panel to manufacture the driver circuit for the gate scan line on the array substrate to achieve driving of the gates by line-by-line scanning.

The GOA circuit must provide the forward and backward scanning function. The common approach is to add a U2D and a D2U scanning units. For forward scanning, the forward scanning control signal U2D is high voltage, and the backward scanning control signal is low voltage. This approach requires the integrated circuit (IC) to provide the function to output the signals, which restricts the choice for the IC. Moreover, because the co-existence of U2D and D2U, the layout also imposes restrictions on the narrow border design, and a higher IC cost will incur.

Refer to FIG. 1. A known GOA circuit, applicable to low temperature polysilicon (LPTS) panel comprises: a plurality of cascade GOA units, an n-th GOA unit outputting a horizontal n-th scan signal comprising: a first thin film transistor (TFT) T1, having a gate connected to the signal output node Gn−2 of the (n−2)-th GOA unit, a source and a drain connected respectively to a node H and an input forward scan control signal U2D; a second TFT T2, having a gate connected to a node Q, a source and a drain connected respectively to the signal output node Gn and an input clock signal CKV1; a third TFT T3, having a gate connected to the signal output node Gn+2 of the (n+2)-th GOA unit, a source and a drain connected respectively to the node H and a backward scan control signal D2U; a fourth TFT T4, having a gate connected to a third node P, a source and a drain connected respectively to the signal output node Gn and a constant low voltage VGL; a fifth TFT T5, having a gate connected to a constant high voltage VGH, a source and a drain connected respectively to the first node H and the second node Q; a sixth TFT T6, having a gate connected to the third node P, a source and a drain connected respectively to the first node H and the constant low voltage VGL; a seventh TFT T7, having a gate connected to the first node H, a source and a drain connected respectively to the third node P and the constant low voltage VGL; an eighth TFT T8, having a gate connected to the clock signal CKV3, a source and a drain connected respectively to the third node P and the constant high voltage VGH; and a first capacitor C1, having two ends connected respectively to the second node Q and the signal output node Gn; a second capacitor C2, having two ends connected respectively to the third node P and the constant low voltage VGL. The node Q is for controlling the gate driving signal output; the node P is the stability point for maintaining the low voltage for node Q and Gn. The dash box in FIG. 1 shows the forward and backward scanning unit for the GOA circuit.

Refer to FIG. 2, which shows a schematic view of timing sequence of forward scanning in the GOA circuit of FIG. 1. Also referring to FIG. 1, the forward scanning of the circuit is described as follows:

During forward scanning, U2D is at high voltage and the D2U is at low voltage.

Stage 1, pre-charging: Gn−2 and U2D are at high voltage, T1 is conductive, node H is pre-charged, when H is at high voltage, T5 is conductive, node Q is pre-charged; when node H is at high voltage, T7 is conductive and node P is lowered down.

Stage 2, Gn outputting high voltage: in Stage 1, node Q is pre-charged and C1 maintains the charges, T2 is conductive, CKV1 outputs high voltage to Gn.

Stage 3, Gn outputting low voltage: C1 maintains the high voltage of node Q, and the low voltage of CKV1 lowers the Gn.

Stage 4, node Q lowered to VGL: when Gn+2 is at high voltage, D2U at this point is at low voltage, T3 is conductive and node Q is lowered to VGL.

Stage 5, node Q and Gn maintained at low voltage: when node Q becomes at low voltage, T7 is cut-off. When CKV3 jumps to high voltage, T8 is conductive, node P is charged to high voltage, then T4 and T6 are conductive to ensure that node Q and Gn are maintained at low voltage; at the same time, C2 maintains the node P at high voltage.

Refer to FIG. 3, which shows a schematic view of timing sequence of backward scanning in the GOA circuit of FIG. 1. Also referring to FIG. 1, the backward scanning of the circuit is described as follows:

During backward scanning, D2U is at high voltage and the U2D is at low voltage.

Stage 1, pre-charging: Gn+2 and D2U are at high voltage, T3 is conductive, node H is pre-charged; when node H is at high voltage, T5 stays in conductive state, and node Q is pre-charged; when node H is at high voltage, T7 is conductive and node P is lowered down.

Stage 2, Gn outputting high voltage: in Stage 1, node Q is pre-charged and C1 maintains the charges, T2 is conductive, CKV1 outputs high voltage to Gn.

Stage 3, Gn outputting low voltage: C maintains the high voltage of node Q, and the low voltage of CKV1 lowers the Gn.

Stage 4, node Q lowered to VGL: when Gn−2 is at high voltage, U2D at this point is at low voltage, T1 is conductive and node Q is lowered to VGL.

Stage 5, node Q and Gn maintained at low voltage: when node Q becomes at low voltage, T7 is cut-off. When CKV3 jumps to high voltage, T8 is conductive, node P is charged, then T4 and T6 are conductive to ensure that node Q and Gn are maintained at low voltage; at the same time, C2 keeps the node P at high voltage.

SUMMARY OF THE INVENTION

The object of the present invention is to provide a GOA circuit, able to realize the forward-and-backward scanning without the forward scan control signal D2U and the backward scan control signal U2D.

To achieve the above object, the present invention provides a GOA circuit, comprising: a plurality of cascade GOA units, for a positive integer n, the n-th GOA unit comprising:

a first thin film transistor (TFT), having a gate connected to a first source/drain of a ninth TFT, when n-th GOA unit not the first GOA unit in the cascade, a source and a drain of the first TFT connected respectively to a signal output node of (n−1)-th GOA unit and a first node, otherwise, the source and the drain of the first TFT connected respectively to a first start signal and a first node;

a ninth TFT, having a second source/drain connected to a first clock signal, when n-th GOA unit not the first GOA unit in the cascade, having a gate connected to a second node of the (n−1)th GOA unit, otherwise, the gate connected to a second start signal;

a third TFT, having a gate connected to a first source/drain of a tenth TFT, when n-th GOA unit not the last GOA unit in the cascade, a source and a drain of the third TFT connected respectively to a signal output node of (n+1)-th GOA unit and the first node, otherwise, the source and the drain of the third TFT connected respectively to a third start signal and the first node;

a tenth TFT, having a second source/drain connected to a third clock signal, when n-th GOA unit not the last GOA unit in the cascade, having a gate connected to the second node of the (n+1)th GOA unit, otherwise, the gate connected to a fourth start signal;

a seventh TFT, having a gate connected to the first node, a source and a drain connected respectively to the third node and a constant low voltage;

a sixth TFT, having a gate connected to the third node, a source and a drain connected respectively to the first node and the constant low voltage;

a fifth TFT, having a gate connected to a constant high voltage, a source and a drain connected respectively to the first node and the second node;

an eighth TFT, having a gate connected to a fourth clock signal, a source and a drain connected respectively to the third node and the constant high voltage;

a first capacitor, having the two ends connected respectively to the second node of n-th GOA unit and the signal output node of n-th GOA unit;

a second TFT, having a gate connected to the second node of n-th GOA unit, a source and a drain connected respectively to the signal output node of n-th GOA unit and the second clock signal;

a second capacitor, having the two ends connected respectively to the third node and the constant low voltage;

a fourth TFT, having a gate connected to the third node, a source and a drain connected respectively to the signal output node of n-th GOA unit and the constant low voltage.

According to a preferred embodiment of the present invention, the first clock signal, the second clock signal, the third clock signal and the fourth clock signal are rectangular waves having a duty ratio of 0.25.

According to a preferred embodiment of the present invention, in forward scanning, the waveforms between the first clock signal and the second clock signal differ by a ¼ cycle; and the waveforms between the first clock signal and the fourth clock signal differ by a ¾ cycle.

According to a preferred embodiment of the present invention, in backward scanning, the waveforms between the third clock signal and the second clock signal differ by a ¼ cycle; and the waveforms between the third clock signal and the fourth clock signal differ by a ¾ cycle.

According to a preferred embodiment of the present invention, for the first GOA unit in the cascade, when starting forward scanning, the first start signal is initially at high voltage; when the first start signal becomes low voltage, the signal output node(Gn) of n-th GOA unit becomes high voltage.

According to a preferred embodiment of the present invention, for the last GOA unit in the cascade, when starting backward scanning, the third start signal is initially at high voltage; when the third start signal becomes low voltage, the signal output node(Gn) of n-th GOA unit becomes high voltage.

According to a preferred embodiment of the present invention, for the first GOA unit in the cascade, in forward scanning, when the first start signal is at high voltage, the second start signal is at high voltage.

According to a preferred embodiment of the present invention, for the last GOA unit in the cascade, in backward scanning, when the third start signal is at high voltage, the fourth start signal is at high voltage.

According to a preferred embodiment of the present invention, the GOA circuit is for low temperature polysilicon (LPTS) panel.

According to a preferred embodiment of the present invention, the GOA circuit is for organic light-emitting diode (OLED) panel.

The present invention also provides a GOA circuit, comprising: a plurality of cascade GOA units, for a positive integer n, the n-th GOA unit comprising:

a first thin film transistor (TFT), having a gate connected to a first source/drain of a ninth TFT, when n-th GOA unit not the first GOA unit in the cascade, a source and a drain of the first TFT connected respectively to a signal output node of (n−1)-th GOA unit and a first node, otherwise, the source and the drain of the first TFT connected respectively to a first start signal and a first node;

a ninth TFT, having a second source/drain connected to a first clock signal, when n-th GOA unit not the first GOA unit in the cascade, having a gate connected to a second node of the (n−1)th GOA unit, otherwise, the gate connected to a second start signal;

a third TFT, having a gate connected to a first source/drain of a tenth TFT, when n-th GOA unit not the last GOA unit in the cascade, a source and a drain of the third TFT connected respectively to a signal output node of (n+1)-th GOA unit and the first node, otherwise, the source and the drain of the third TFT connected respectively to a third start signal and the first node;

a tenth TFT, having a second source/drain connected to a third clock signal, when n-th GOA unit not the last GOA unit in the cascade, having a gate connected to the second node of the (n+1)th GOA unit, otherwise, the gate connected to a fourth start signal;

a seventh TFT, having a gate connected to the first node, a source and a drain connected respectively to the third node and a constant low voltage;

a sixth TFT, having a gate connected to the third node, a source and a drain connected respectively to the first node and the constant low voltage;

a fifth TFT, having a gate connected to a constant high voltage, a source and a drain connected respectively to the first node and the second node;

an eighth TFT, having a gate connected to a fourth clock signal, a source and a drain connected respectively to the third node and the constant high voltage;

a first capacitor, having the two ends connected respectively to the second node of n-th GOA unit and the signal output node of n-th GOA unit;

a second TFT, having a gate connected to the second node of n-th GOA unit, a source and a drain connected respectively to the signal output node of n-th GOA unit and the second clock signal;

a second capacitor, having the two ends connected respectively to the third node and the constant low voltage;

a fourth TFT, having a gate connected to the third node, ae source and a drain connected respectively to the signal output node of n-th GOA unit and the constant low voltage;

wherein the first clock signal, the second clock signal, the third clock signal and the fourth clock signal being rectangular waves having a duty ratio of 0.25;

wherein in forward scanning, the waveforms between the first clock signal and the second clock signal differing by a ¼ cycle; and the waveforms between the first clock signal and the fourth clock signal differing by a ¾ cycle;

wherein in backward scanning, the waveforms between the third clock signal and the second clock signal differing by a ¼ cycle; and the waveforms between the third clock signal and the fourth clock signal differing by a ¾ cycle.

Compared to the known techniques, the present invention provides the following advantages: the GOA circuit of the present invention achieves forward and backward scanning without using D2U and U2D control signals, which facilitates the narrow border design; as well as simplify the corresponding driving timing and reduce the IC cost. Moreover, the circuit can effectively improve the current leakage at node Q and ensure GOA circuit stability.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technical means and effect of the present invention, the following refers to embodiments and drawings for detailed description.

Figure 1:
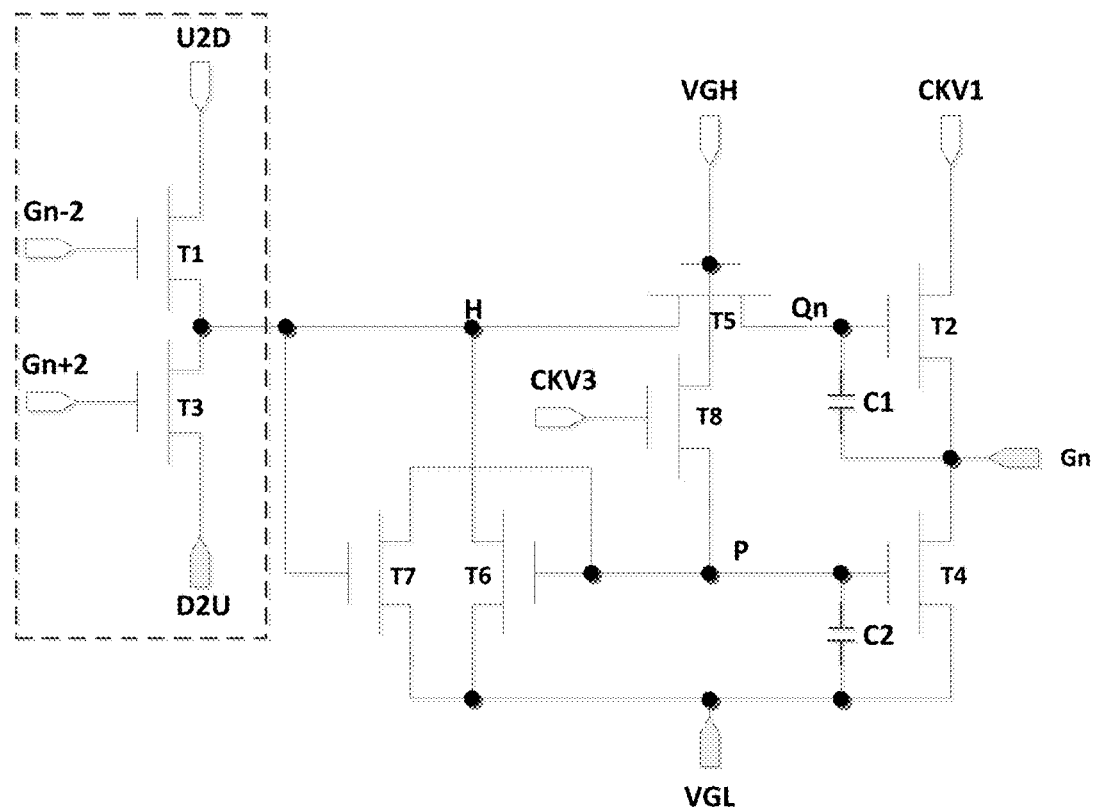
FIG. 1 is a schematic view showing a known GOA circuit.
Figure 2:
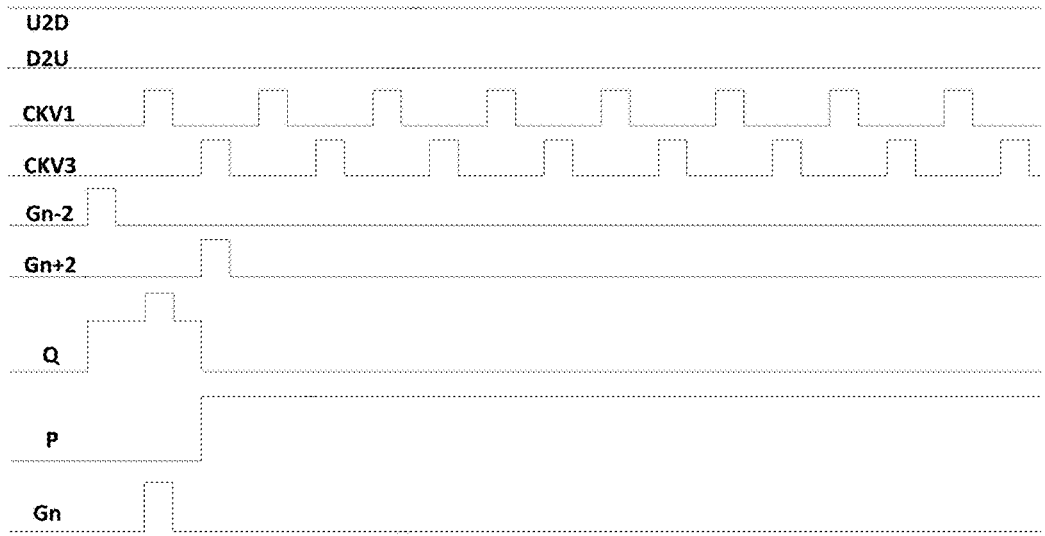
FIG. 2 is a schematic view showing the forward scanning timing for the GOA circuit of FIG. 1.
Figure 3:
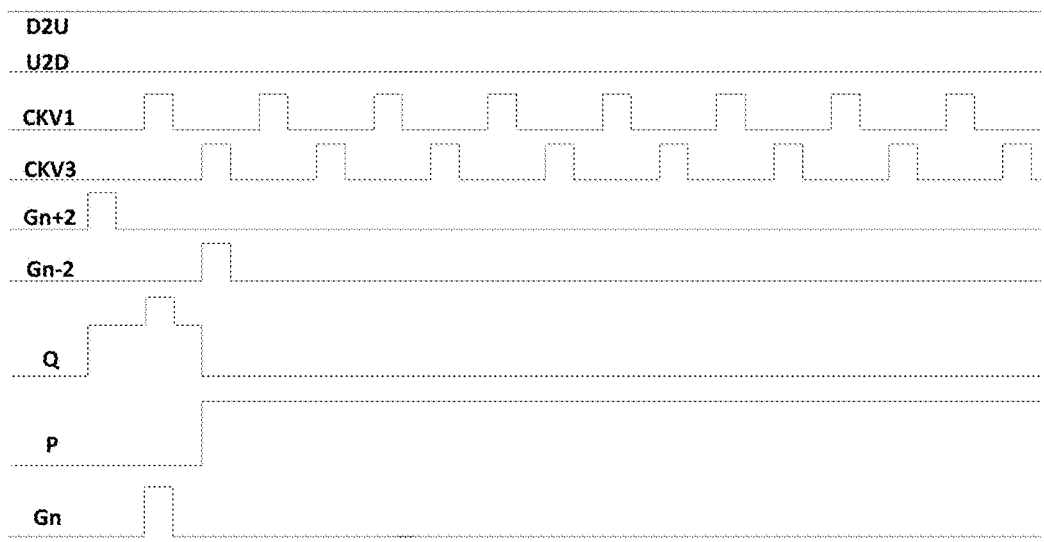
FIG. 3 is a schematic view showing the backward scanning timing for the GOA circuit of FIG. 1.
Figure 4:
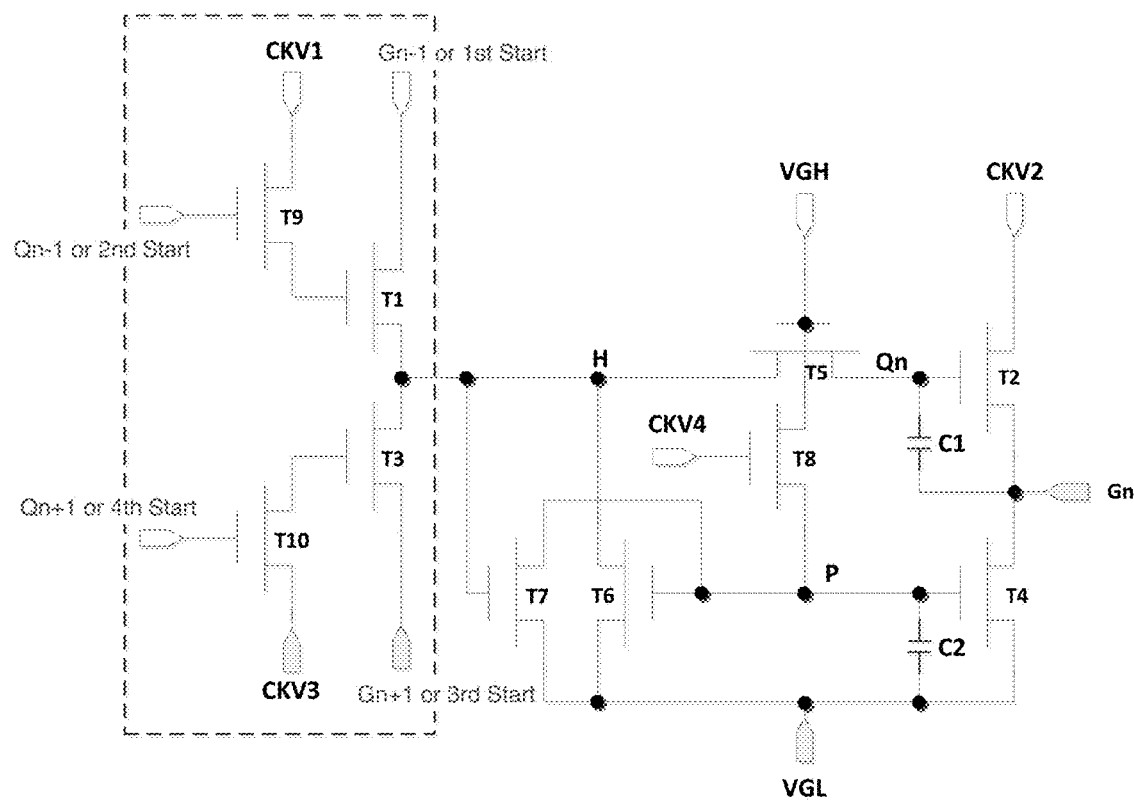
FIG. 4 is a schematic view showing the GOA circuit provided by an embodiment of the present invention.

Refer to FIG. 4. The present invention provides a GOA circuit, applicable to an LTPS panel. The GOA circuit comprises: a plurality of cascade GOA units, for a positive integer n, the n-th GOA unit comprising: a first thin film transistor (TFT) T1, having a gate connected to a first source/drain of a ninth TFT T9, when n-th GOA unit not the first GOA unit in the cascade, a source and a drain of the first TFT T1 connected respectively to a signal output node Gn-1 of (n−1)-th GOA unit and a first node H; a second TFT T2, having a gate connected to a second node Qn of n-th GOA unit, a source and ae drain connected respectively to the signal output node Gn of n-th GOA unit and a second clock signal CKV2; a third TFT T3, when n-th GOA unit not the last GOA unit in the cascade, having a gate connected to a first source/drain of a tenth TFT T10, a source and a drain connected respectively to a signal output node Gn+1 of (n+1)-th GOA unit and the first node H; a fourth TFT T4, having a gate connected to the third node P, a source and a drain connected respectively to the signal output node Gn of n-th GOA unit and a constant low voltage VGL; a fifth TFT T5, having a gate connected to a constant high voltage VGH, a source and a drain connected respectively to the first node H and the second node Qn; a sixth TFT T6, having a gate connected to the third node P, a source and a drain connected respectively to the first node H and the constant low voltage VGL; a seventh TFT T7, having a gate connected to the first node H, a source and a drain connected respectively to the third node P and the constant low voltage VGL; an eighth TFT T8, having a gate connected to a fourth clock signal CKV4, a source and a drain connected respectively to the third node P and the constant high voltage VHG; a ninth TFT T9, when n-th GOA unit not the first GOA unit in the cascade, having a gate connected to the second node Qn−1 of the (n−1)th GOA unit, having a second source/drain connected to a first clock signal CKV1; a tenth TFT T10, when n-th GOA unit not the last GOA unit in the cascade, having the gate connected to the second node Qn+1 of the (n+1)th GOA unit, having a second source/drain connected to a third clock signal CKV3; a first capacitor C1, having the two ends connected respectively to the second node Qn of n-th GOA unit and the signal output node Gn of n-th GOA unit; a second capacitor C2, having the two ends connected respectively to the third node P and the constant low voltage VGL.

Figure 5:
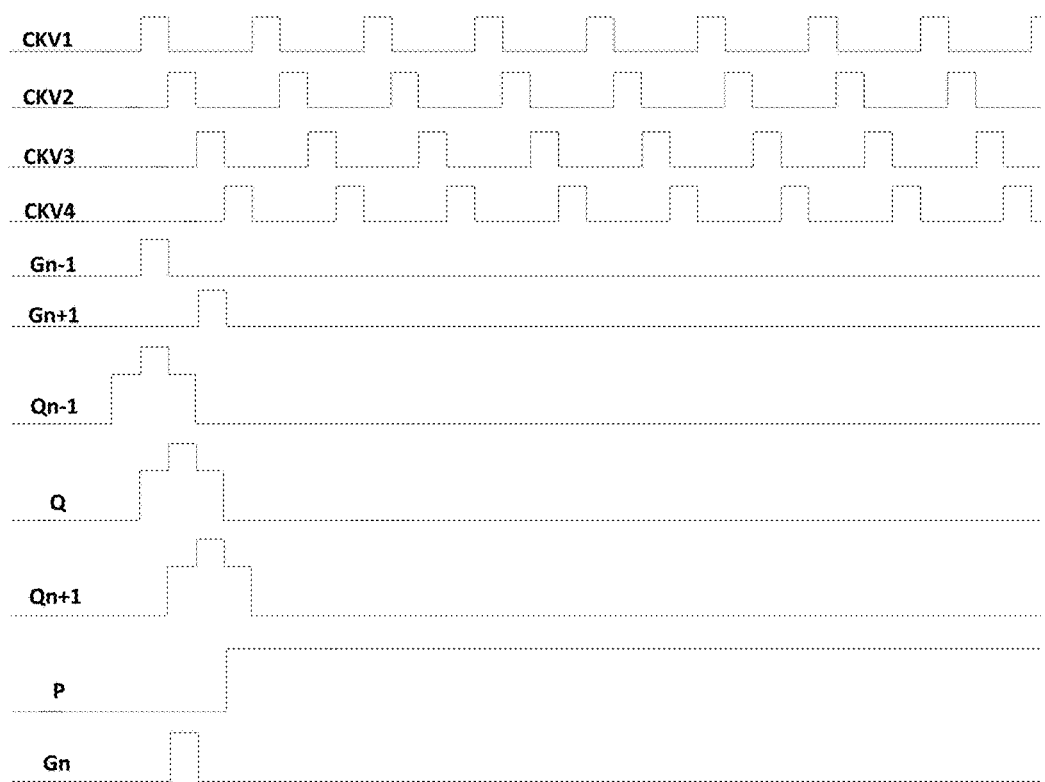
FIG. 5 is a schematic view showing the forward scanning timing for GOA circuit of FIG. 4.

Refer to FIG. 5, which shows a schematic view of timing sequence of forward scanning in the GOA circuit of FIG. 4. Also referring to FIG. 4, the forward scanning of the circuit is described as follows:

Stage 1, pre-charging: Gn-1 and CKV1 are at high voltage, T9 is conductive, Gn-1 is also at high voltage, T1 is conductive, and the node H is pre-charged; when node H is at high voltage, T5 stays in conductive state, and the node Q (i.e., Qn) is pre-charged; when node H is at high voltage, T7 is conductive, and node P is lowered down.

Stage 2, Gn outputting high voltage: in Stage 1, the node Q is pre-charged and C1 maintains the charges, T2 is conductive, CKV2 outputs high voltage to Gn.

Stage 3, Gn outputting low voltage: C1 maintains the high voltage of node Q, and the low voltage of CKV2 lowers the Gn.

Stage 4, node Q lowered to VGL: when CKV4 is at high voltage, T8 is conductive, node P is charged, T6 is conductive and node Q is lowered.

Stage 5, node Q and Gn maintained at low voltage: when node Q becomes at low voltage, T7 is cut-off. When CKV4 jumps to high voltage, T8 is conductive, node P is charged to high voltage, T4 and T6 are conductive to ensure that node Q and Gn are maintained at low voltage; at the same time, C2 keeps node P at high voltage.

The present invention provides a GOA circuit. As shown in dashed box of FIG. 4 and the forward scanning timing diagram in FIG. 5, based on the known GOA circuit, the present invention uses T9 and T10 so that the GOA circuit does not require D2U and U2D control signals to achieve forward and backward scanning functions. This design facilitates narrow-border display, as well as simplifies the corresponding driving timing and reduces the IC cost. Moreover, the pre-charging unit formed by T1, T9, T3 and T10 are at high voltage only in pre-charging stage, and stay at low voltage at other stages. As such, the current leakage can be effective improved to ensure the GOA circuit stability.

Figure 6:
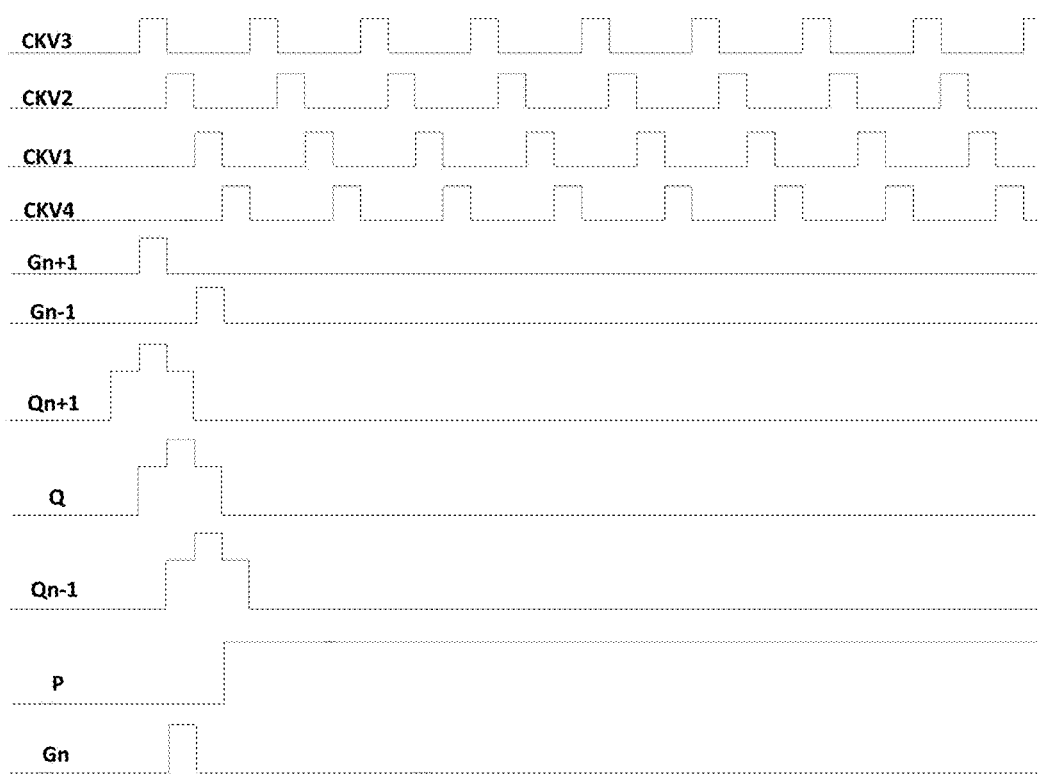
FIG. 6 is a schematic view showing the backward scanning timing for GOA circuit of FIG. 4.

Refer to FIG. 6, which shows a schematic view of timing sequence of backward scanning in the GOA circuit of FIG. 4. Also referring to FIG. 4, the backward scanning of the circuit is described as follows:

Stage 1, pre-charging: Gn+1 and CKV3 are at high voltage, T10 is conductive, the node H is pre-charged; when node H is at high voltage, T5 stays in conductive state, and node Q (i.e., Qn) is pre-charged; when node H is at high voltage, T7 is conductive and node P is lowered down.

Stage 2, Gn outputting high voltage: in Stage 1, the node Q is pre-charged and C1 maintains the charges, T2 is conductive, CKV2 outputs high voltage to Gn.

Stage 3, Gn outputting low voltage: C1 maintains the high voltage of node Q, and the low voltage of CKV2 lowers the Gn.

Stage 4, node Q lowered to VGL: when CKV4 is at high voltage, T8 is conductive, node P is charged, T6 is conductive and node Q is lowered.

Stage 5, node Q and Gn maintained at low voltage: when node Q becomes at low voltage, T7 is cut-off. When CKV4 jumps to high voltage, node P is charged to high voltage, then T4 and T6 are conductive to ensure that node Q and Gn are maintained at low voltage; at the same time, C2 keeps node P at high voltage.

The present invention provides a GOA circuit. As shown in dashed box of FIG. 4 and the backward scanning timing diagram in FIG. 6, based on the known GOA circuit, the present invention uses T9 and T10 so that the GOA circuit does not require D2U and U2D control signals to achieve forward and backward scanning functions. This design facilitates narrow-border display, as well as simplifies the corresponding driving timing and reduces the IC cost. Moreover, the pre-charging unit formed by T1, T9, T3 and T10 are at high voltage only in pre-charging stage, and stay at low voltage at other stages. As such, the current leakage can be effective improved to ensure the GOA circuit stability.

As shown in FIG. 5 and FIG. 6, both the first clock signal CKV1, the second clock signal CKV2, the third clock signal CKV3 and the fourth clock signal CKV4 are rectangular waves having a duty ratio of 0.25. In forward scanning, the waveforms between the first clock signal and the second clock signal differ by a ¼ cycle; and the waveforms between the first clock signal and the fourth clock signal differ by a ¾ cycle. In backward scanning, the waveforms between the third clock signal and the second clock signal differ by a ¼ cycle; and the waveforms between the third clock signal and the fourth clock signal differ by a ¾ cycle.

The present invention replaces the missing signal input for the first and the last GOA units by inputting start signals. For the first GOA unit in the cascade, when starting forward scanning, the first start signal is initially at high voltage; when the first start signal becomes low voltage, the signal output node Gn of n-th GOA unit becomes high voltage. For the last GOA unit in the cascade, when starting backward scanning, the third start signal is initially at high voltage; when the third start signal becomes low voltage, the signal output node Gn of n-th GOA unit becomes high voltage.

For the first GOA unit in the cascade, in forward scanning, when the first start signal is at high voltage, the second start signal is at high voltage. For the last GOA unit in the cascade, in backward scanning, when the third start signal is at high voltage, the fourth start signal is at high voltage.

The GOA circuit of the present invention can be applied and potentially applied to the following: 1, integrated gate driver circuit on the array substrate of LCD; 2, the gate driving for mobile phones, displays and TVs; 3, advanced technology for LCD and OLED industry; and 4, the circuit stability of the present invention applicable to high-resolution panel.

In summary, the GOA circuit of the present invention can achieve forward and backward scanning functions without D2U and U2D control signals. This design facilitates narrow-border display, as well as simplifies the corresponding driving timing and reduces the IC cost. Moreover, the pre-charging unit formed by T1, T9, T3 and T10 are at high voltage only in pre-charging stage, and stay at low voltage at other stages. As such, the current leakage can be effective improved to ensure the GOA circuit stability.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A gate driver on array (GOA) circuit, comprising a plurality of cascade GOA units, for a positive integer n, the n-th GOA unit comprising:

a first thin film transistor (TFT), having a gate of the first TFT directly connected to a first source/drain of a ninth TFT, when n-th GOA unit not the first GOA unit in the cascade, a source and a drain of the first TFT connected respectively to a signal output node of (n−1)-th GOA unit and a first node, otherwise, the source and the drain of the first TFT connected respectively to a first start signal and a first node;

a ninth TFT, having a second source/drain of the ninth TFT directly inputted with a first clock signal, when n-th GOA unit not the first GOA unit in the cascade, having a gate of the ninth TFT directly connected to a second node of the (n−1)th GOA unit, otherwise, the gate of the ninth TFT directly connected to a second start signal;

a third TFT, having a gate of the third TFT directly connected to a first source/drain of a tenth TFT, when n-th GOA unit not the last GOA unit in the cascade, a source and a drain of the third TFT connected respectively to a signal output node of (n+1)-th GOA unit and the first node, otherwise, the source and the drain of the third TFT directly connected respectively to a third start signal and the first node;

a tenth TFT, having a second source/drain of the tenth TFT directly connected to a third clock signal, when n-th GOA unit not the last GOA unit in the cascade, having a gate of the tenth TFT directly connected to the second node of the (n+1)th GOA unit, otherwise, the gate of the tenth TFT directly connected to a fourth start signal;

a seventh TFT, having a gate of the seventh TFT directly connected to the first node, a source and a drain of the seventh TFT directly connected respectively to the third node and a constant low voltage;

a sixth TFT, having a gate of the sixth TFT directly connected to the third node, a source and a drain of the sixth TFT directly connected respectively to the first node and the constant low voltage;

a fifth TFT, having a gate of the fifth TFT directly connected to a constant high voltage, a source and a drain of the fifth TFT directly connected respectively to the first node and the second node;

an eighth TFT, having a gate of the eighth TFT directly connected to a fourth clock signal, a source and a drain of the eighth TFT directly connected respectively to the third node and the constant high voltage;

a first capacitor, having the two ends connected respectively to the second node of n-th GOA unit and the signal output node of n-th GOA unit;

a second TFT, having the gate of the second TFT directly connected to the second node of n-th GOA unit, a source and a drain of the second TFT directly connected respectively to the signal output node of n-th GOA unit and the second clock signal;

a second capacitor, having the two ends connected respectively to the third node and the constant low voltage;

a fourth TFT, having a gate of the fourth TFT directly connected to the third node, a source and a drain of the fourth TFT directly connected respectively to the signal output node of n-th GOA unit and the constant low voltage.

2. The GOA circuit as claimed in claim 1, wherein the first clock signal, the second clock signal, the third clock signal and the fourth clock signal are rectangular waves having a duty ratio of 0.25.

3. The GOA circuit as claimed in claim 2, wherein in forward scanning, the waveforms between the first clock signal and the second clock signal differ by a ¼ cycle; and the waveforms between the first clock signal and the fourth clock signal differ by a ¾ cycle.

4. The GOA circuit as claimed in claim 2, wherein in backward scanning, the waveforms between the third clock signal and the second clock signal differ by a ¼ cycle; and the waveforms between the third clock signal and the fourth clock signal differ by a ¾ cycle.

5. The GOA circuit as claimed in claim 1, wherein for the first GOA unit in the cascade, when starting forward scanning, the first start signal is initially at high voltage; when the first start signal becomes low voltage, the signal output node (Gn) of n-th GOA unit becomes high voltage.

6. The GOA circuit as claimed in claim 1, wherein for the last GOA unit in the cascade, when starting backward scanning, the third start signal is initially at high voltage; when the third start signal becomes low voltage, the signal output node (Gn) of n-th GOA unit becomes high voltage.

7. The GOA circuit as claimed in claim 1, wherein for the first GOA unit in the cascade, in forward scanning, when the first start signal is at high voltage, the second start signal is at high voltage.

8. The GOA circuit as claimed in claim 1, wherein for the last GOA unit in the cascade, in backward scanning, when the third start signal is at high voltage, the fourth start signal is at high voltage.

9. The GOA circuit as claimed in claim 1, wherein the GOA circuit is for low temperature polysilicon (LPTS) panel.

10. The GOA circuit as claimed in claim 1, wherein the GOA circuit is for organic light-emitting diode (OLED) panel.

11. A gate driver on array (GOA) circuit, comprising a plurality of cascade GOA units, for a positive integer n, the n-th GOA unit comprising:

a first thin film transistor (TFT), having a gate of the first TFT directly connected to a first source/drain of a ninth TFT, when n-th GOA unit not the first GOA unit in the cascade, a source and a drain of the first TFT connected respectively to a signal output node of (n−1)-th GOA unit and a first node, otherwise, the source and the drain of the first TFT connected respectively to a first start signal and a first node;

a ninth TFT, having a second source/drain of the ninth TFT directly connected to a first clock signal, when n-th GOA unit not the first GOA unit in the cascade, having a gate of the ninth TFT directly connected to a second node of the (n−1)th GOA unit, otherwise, the gate of the ninth TFT directly connected to a second start signal;

a third TFT, having a gate of the third TFT directly connected to a first source/drain of a tenth TFT, when n-th GOA unit not the last GOA unit in the cascade, a source and a drain of the third TFT connected respectively to a signal output node of (n+1)-th GOA unit and the first node, otherwise, the source and the drain of the third TFT connected respectively to a third start signal and the first node;

a tenth TFT, having a second source/drain of the tenth TFT directly connected to a third clock signal, when n-th GOA unit not the last GOA unit in the cascade, having a gate of the tenth TFT directly connected to the second node of the (n+1)th GOA unit, otherwise, the gate of the tenth TFT directly connected to a fourth start signal;

a seventh TFT, having a gate of the seventh TFT directly connected to the first node, a source and a drain of the seventh TFT directly connected respectively to the third node and a constant low voltage;

a sixth TFT, having a gate of the sixth TFT directly connected to the third node, a source and a drain of the sixth TFT directly connected respectively to the first node and the constant low voltage;

a fifth TFT, having a gate of the fifth TFT directly connected to a constant high voltage, a source and a drain of the fifth TFT directly connected respectively to the first node and the second node;

an eighth TFT, having a gate of the eighth TFT directly connected to a fourth clock signal, a source and a drain of the eighth TFT directly connected respectively to the third node and the constant high voltage;

a first capacitor, having the two ends connected respectively to the second node of n-th GOA unit and the signal output node of n-th GOA unit;

a second TFT, having a gate of the second TFT directly connected to the second node of n-th GOA unit, a source and a drain of the second TFT directly connected respectively to the signal output node of n-th GOA unit and the second clock signal;

a second capacitor, having the two ends connected respectively to the third node and the constant low voltage;

a fourth TFT, having a gate of the fourth TFT directly connected to the third node, a source and a drain of the fourth TFT directly connected respectively to the signal output node of n-th GOA unit and the constant low voltage;

wherein the first clock signal, the second clock signal, the third clock signal and the fourth clock signal being rectangular waves having a duty ratio of 0.25;

wherein in forward scanning, the waveforms between the first clock signal and the second clock signal differing by a ¼ cycle; and the waveforms between the first clock signal and the fourth clock signal differing by a ¾ cycle;

wherein in backward scanning, the waveforms between the third clock signal and the second clock signal differing by a ¼ cycle; and the waveforms between the third clock signal and the fourth clock signal differing by a ¾ cycle.

12. The GOA circuit as claimed in claim 11, wherein for the first GOA unit in the cascade, when starting forward scanning, the first start signal is initially at high voltage; when the first start signal becomes low voltage, the signal output node (Gn) of n-th GOA unit becomes high voltage.

13. The GOA circuit as claimed in claim 11, wherein for the last GOA unit in the cascade, when starting backward scanning, the third start signal is initially at high voltage; when the third start signal becomes low voltage, the signal output node (Gn) of n-th GOA unit becomes high voltage.

14. The GOA circuit as claimed in claim 11, wherein for the first GOA unit in the cascade, in forward scanning, when the first start signal is at high voltage, the second start signal is at high voltage.

15. The GOA circuit as claimed in claim 11, wherein for the last GOA unit in the cascade, in backward scanning, when the third start signal is at high voltage, the fourth start signal is at high voltage.

16. The GOA circuit as claimed in claim 11, wherein the GOA circuit is for low temperature polysilicon (LPTS) panel.

17. The GOA circuit as claimed in claim 11, wherein the GOA circuit is for organic light-emitting diode (OLED) panel.

\* \* \* \* \*